US010459014B2

(12) United States Patent
Yokota et al.

(10) Patent No.: US 10,459,014 B2
(45) Date of Patent: Oct. 29, 2019

(54) ELECTRONIC DEVICE

(71) Applicant: Kabushiki Kaisha Toshiba, Minato-ku, Tokyo (JP)

(72) Inventors: Ryuhei Yokota, Tachikawa Tokyo (JP); Toshikazu Mukaiyama, Nashitama Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 252 days.

(21) Appl. No.: 15/607,060

(22) Filed: May 26, 2017

(65) Prior Publication Data

US 2017/0269131 A1    Sep. 21, 2017

Related U.S. Application Data

(63) Continuation of application No. PCT/JP2014/081239, filed on Nov. 26, 2014.

(51) Int. Cl.
*G01R 19/25* (2006.01)
*G01R 11/02* (2006.01)
(Continued)

(52) U.S. Cl.
CPC .......... *G01R 19/2513* (2013.01); *G01R 11/02* (2013.01); *G01R 31/026* (2013.01);
(Continued)

(58) Field of Classification Search
None
See application file for complete search history.

(56) References Cited

U.S. PATENT DOCUMENTS 6,246,677 B1    6/2001   Nap et al.
6,538,577 B1    3/2003   Ehrke et al.
(Continued)

FOREIGN PATENT DOCUMENTS

JP    S63-166326 A    7/1988
JP    2000-507707 A    6/2000
(Continued)

OTHER PUBLICATIONS

International Search Report & Written Opinion mailed by Japan Patent Office dated Mar. 3, 2015 in the corresponding PCT Application No. PCT/JP2014/081239, 16 pages.

*Primary Examiner* — Melissa J Koval
*Assistant Examiner* — Nasima Monsur
(74) *Attorney, Agent, or Firm* — Knobbe, Martens, Olson & Bear, LLP

(57) ABSTRACT

According to one embodiment, an electronic device includes a transformer connected to a power supply device, a super capacitor chargeable with an output of the transformer, a voltage converter connected to the transformer, a processor having a power supply terminal supplied with an output of the voltage converter, first and second photo-couplers connected to the power supply device, and a capacitor connected to a primary side of the second photo-coupler through a resistor. The primary side of the second photo-coupler is grounded via a pull-down resistor. The processor includes first and second terminals connected to the first and second photo-couplers and a third terminal supplied with a charging voltage of the super capacitor.

18 Claims, 11 Drawing Sheets

(51) Int. Cl.
  G06K 19/07  (2006.01)
  H04B 17/00  (2015.01)
  G01R 31/02  (2006.01)
  G01R 21/00  (2006.01)
  H02M 3/335  (2006.01)
  H04Q 9/00  (2006.01)

(52) U.S. Cl.
  CPC ............ G06K 19/07 (2013.01); H04B 17/00 (2013.01); G01R 21/007 (2013.01); H02M 3/33507 (2013.01); H04Q 9/00 (2013.01); H04Q 2209/43 (2013.01); H04Q 2209/60 (2013.01)

(56) References Cited

U.S. PATENT DOCUMENTS

| | | |
|---|---|---|
| 7,064,679 B2 | 6/2006 | Ehrke et al. |
| 7,108,715 B2 | 9/2006 | Lawrence-Brown et al. |
| 7,277,027 B2 | 10/2007 | Ehrke et al. |
| 7,772,989 B2 | 8/2010 | Ehrke et al. |
| 7,868,782 B2 | 1/2011 | Ehrke et al. |
| 8,537,028 B2 | 9/2013 | Ehrke et al. |
| 2003/0093145 A1 | 5/2003 | Lawrence-Brown et al. |
| 2003/0122686 A1 | 7/2003 | Ehrke et al. |
| 2004/0066310 A1 | 4/2004 | Ehrke et al. |
| 2007/0194759 A1* | 8/2007 | Shimizu ............... H02J 7/0016 320/166 |
| 2008/0024320 A1 | 1/2008 | Ehrke et al. |
| 2008/0129538 A1 | 6/2008 | Vaswani et al. |
| 2008/0136667 A1 | 6/2008 | Vaswani et al. |
| 2008/0238714 A1 | 10/2008 | Ehrke et al. |
| 2008/0238716 A1 | 10/2008 | Ehrke et al. |
| 2010/0141474 A1 | 6/2010 | Ehrke et al. |
| 2011/0285543 A1 | 11/2011 | Ehrke et al. |
| 2013/0114313 A1* | 5/2013 | Jung ...................... H02M 1/36 363/49 |
| 2013/0170621 A1* | 7/2013 | Saka ................ H02M 3/33523 378/104 |
| 2013/0195497 A1* | 8/2013 | Shimura ................ G03G 15/80 399/88 |
| 2013/0278077 A1* | 10/2013 | Mueck ..................... H02J 1/02 307/105 |

FOREIGN PATENT DOCUMENTS

| | | |
|---|---|---|
| JP | 2005-507707 A | 3/2005 |
| JP | 2010-160651 A | 7/2010 |
| JP | 2010-288134 A | 12/2010 |
| JP | 2012-232157 A | 11/2012 |

* cited by examiner

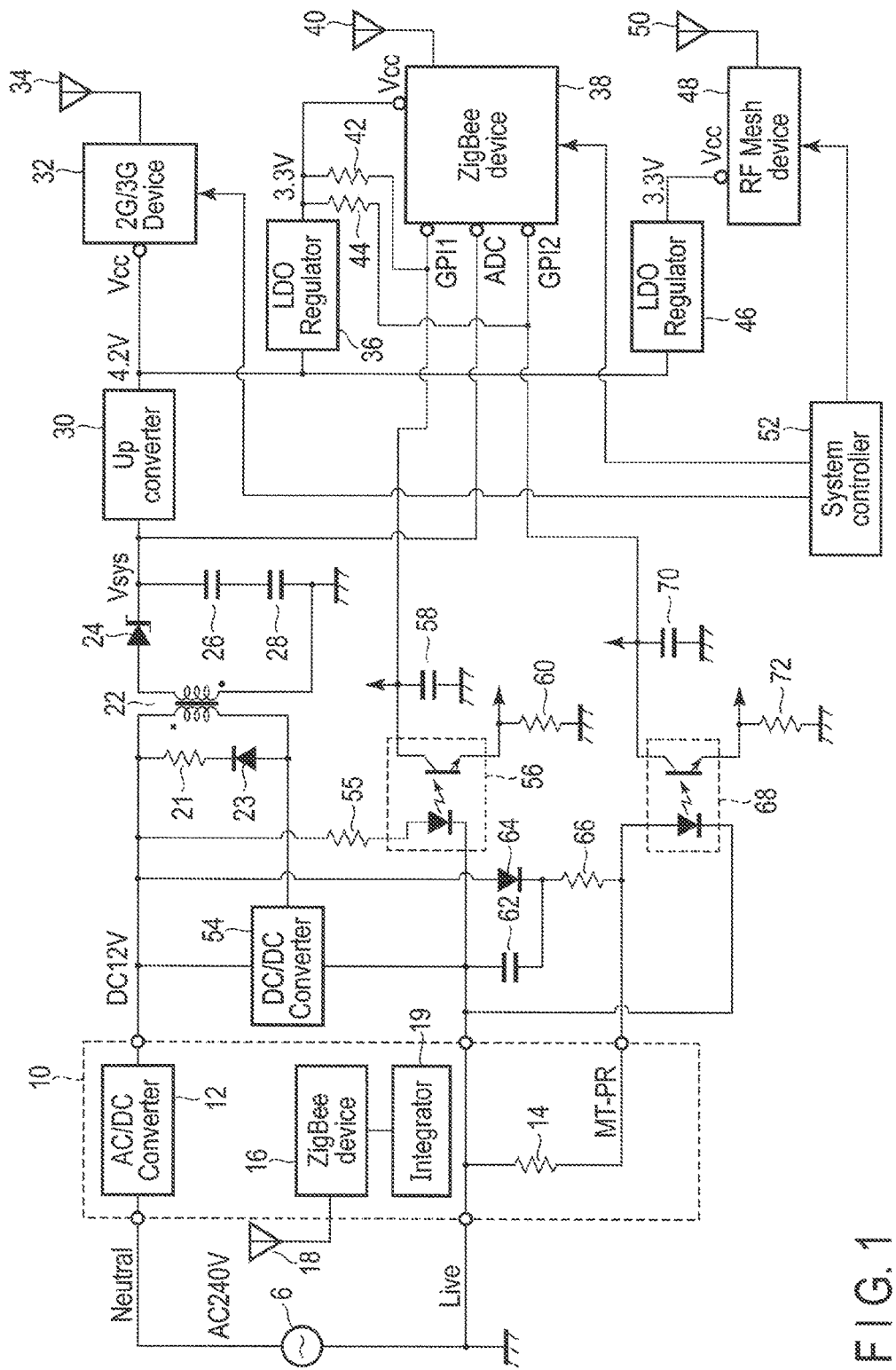
F I G. 1

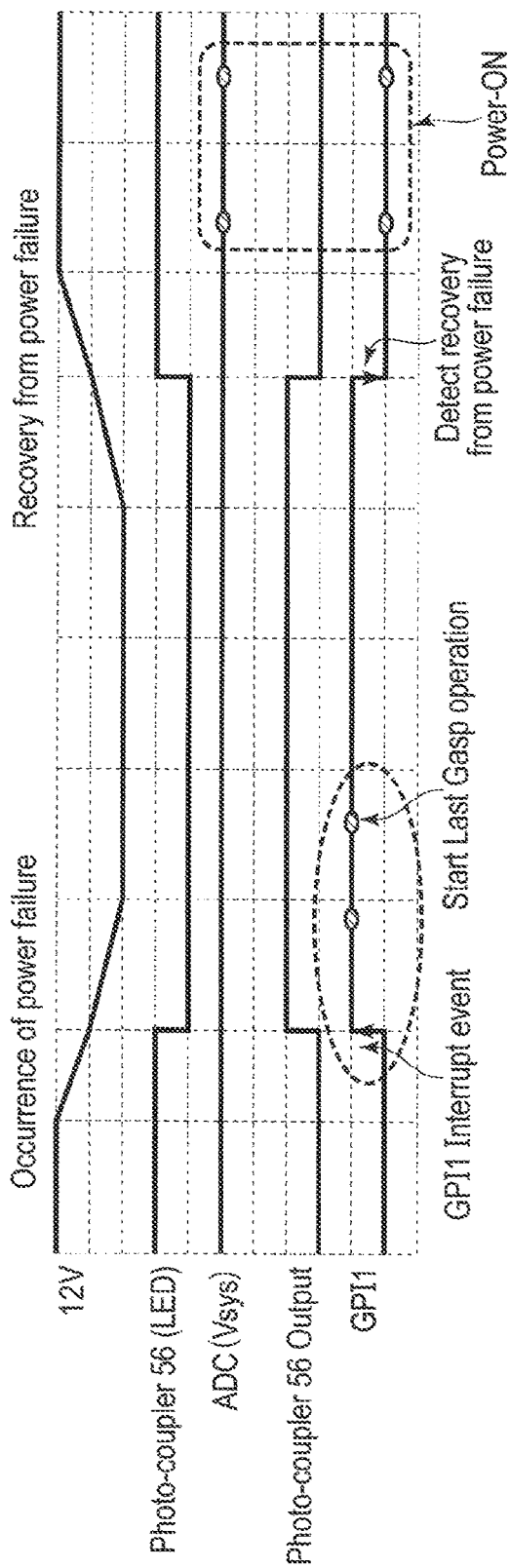
F I G. 2

| GPI1 | GPI2 | ADC | VCC | State (Power failure) | | | | State (Tamper) | | | |
|---|---|---|---|---|---|---|---|---|---|---|---|
| L (12V present) | L (Separate) | Lower than 1.0V | 0V | (6) Several tens of minutes from power failure (Shutdown; Super Cap remaining capacity not present) | | | | (6)-2 Several tens of minutes after CH separation (Shutdown; Super Cap remaining capacity not present) | | | |
| | | 1.0V or higher - lower than 3.8V | 0V | N/A (ZigBee device 38, or, LDO failure) | | | | | | | |
| | | | 3.3V | N/A (ZigBee device 38 ADC failure) | | | | | | | |
| | | 3.8V or higher | 0V | N/A (ZigBee device 38, or, LDO failure) | | | | | | | |
| | | | 3.3V | N/A (Tamper detection failure) | | | | | | | |
| | H (Attach) | Lower than 1.0V | 0V | N/A (ZigBee device 38, or, LDO failure) | | | | | | | |
| | | | 3.3V | N/A (ZigBee device 38 ADC failure) | | | | | | | |
| | | 1.0V or higher - lower than 3.8V | 0V | N/A (ZigBee device 38, or, LDO failure) | | | | | | | |
| | | | 3.3V | (7) Recovery after several tens of minutes from power failure | | | | (7) Attachment after several tens of minutes from CH separation | | | |
| | | 3.8V or higher | 0V | N/A (ZigBee device 38, or, LDO failure) | | | | | | | |
| | | | 3.3V | (1) Normal power supply | (3) Recovery immediately after power failure | (5) Recovery after several minutes from power failure | (8) Recovery after several tens of minutes from power failure, and 60 seconds pass | (1) Attachment of CH | (3) Reattachment immediately after CH separation | (5) Reattachment after several minutes after CH separation | (8) Reattachment after several tens of minutes from CH separation, and 60 seconds passed |
| H (12V not present) | L (Separate) | Lower than 1.0V | 0V | N/A (ZigBee device 38 ADC failure) | | | | | | | |
| | | | 3.3V | N/A (ZigBee device 38 ADC failure) | | | | | | | |
| | | 1.0V or higher - lower than 3.8V | 0V | N/A (ZigBee device 38, or, LDO failure) | | | | | | | |
| | | | 3.3V | N/A (EM357, or, LDO failure) | | | | (6)-1 Several tens of minutes after CH separation (Shutdown; Super Cap remaining capacity present) | | | |
| | | 3.8V or higher | 0V | N/A (ZigBee device 38 ADC failure) | | | | (2) Immediately after CH separation | | | |
| | | | 3.3V | (4) Several minutes have passed since power failure (Shutdown; Super Cap remaining capacity present) | | | | N/A (ZigBee device 38 ADC failure) | | | |
| | H (Attach) | Lower than 1.0V | 0V | N/A (ZigBee device 38 ADC failure) | | | | | | | |
| | | | 3.3V | N/A (ZigBee device 38 ADC failure) | | | | | | | |
| | | 1.0V or higher - lower than 3.8V | 0V | N/A (ZigBee device 38, or, LDO failure) | | | | | | | |
| | | | 3.3V | (2) Immediately after power failure | | | | (4) Several minutes after CH separation | | | |
| | | 3.8V or higher | 0V | N/A (ZigBee device 38, or, LDO failure) | | | | | | | |

F I G. 6

| Power failure occurrence conditions | Detecting device | Detecting pins | (1) Power supply time | (2) Immediately after power failure | (3) Recovery immediately after power failure | (4) After several minutes from power failure | (5) Recovery after several minutes from power failure | (6) After several tens of minutes from power failure | (7) Recovery after several tens of minutes from power failure | (8) Recovery after several tens of minutes from power failure, and 60s passed |
|---|---|---|---|---|---|---|---|---|---|---|
| Detection of power failure (DC 12V) | ZigBee device 38 | GPI1 | L | L→H | H→L | H | H→L | L | Remains L | L |
| Detection of Tamper (MT_PR) | ZigBee device 38 | GPI2 | H | H | Remains H | H | Remains H | L | L→H | H |
| Confirmation of state | ZigBee device 38 | ADC | 3.8V or higher | 3.8V or higher | 3.8V or higher | 1.0V~3.8V | 3.8V or higher | 1.0V or lower | 1.0V~3.8V | 3.8V or higher |
| ZigBee power | ZigBee device 38 | VCC | 3.3V | 3.3V | 3.3V | 3.3V | 3.3V | 0V | 3.3V(POR) | 3.3V |
| Action | | | Wait interrupt event | Start determination of Last Gasp condition | Notify recovery from power failure | Shut down after ending of Last Gasp | Wait 3.8V or higher and notify recovery | G3 state | Start counting 60 seconds after POR | System startup & notify recovery from power failure |

F I G. 8

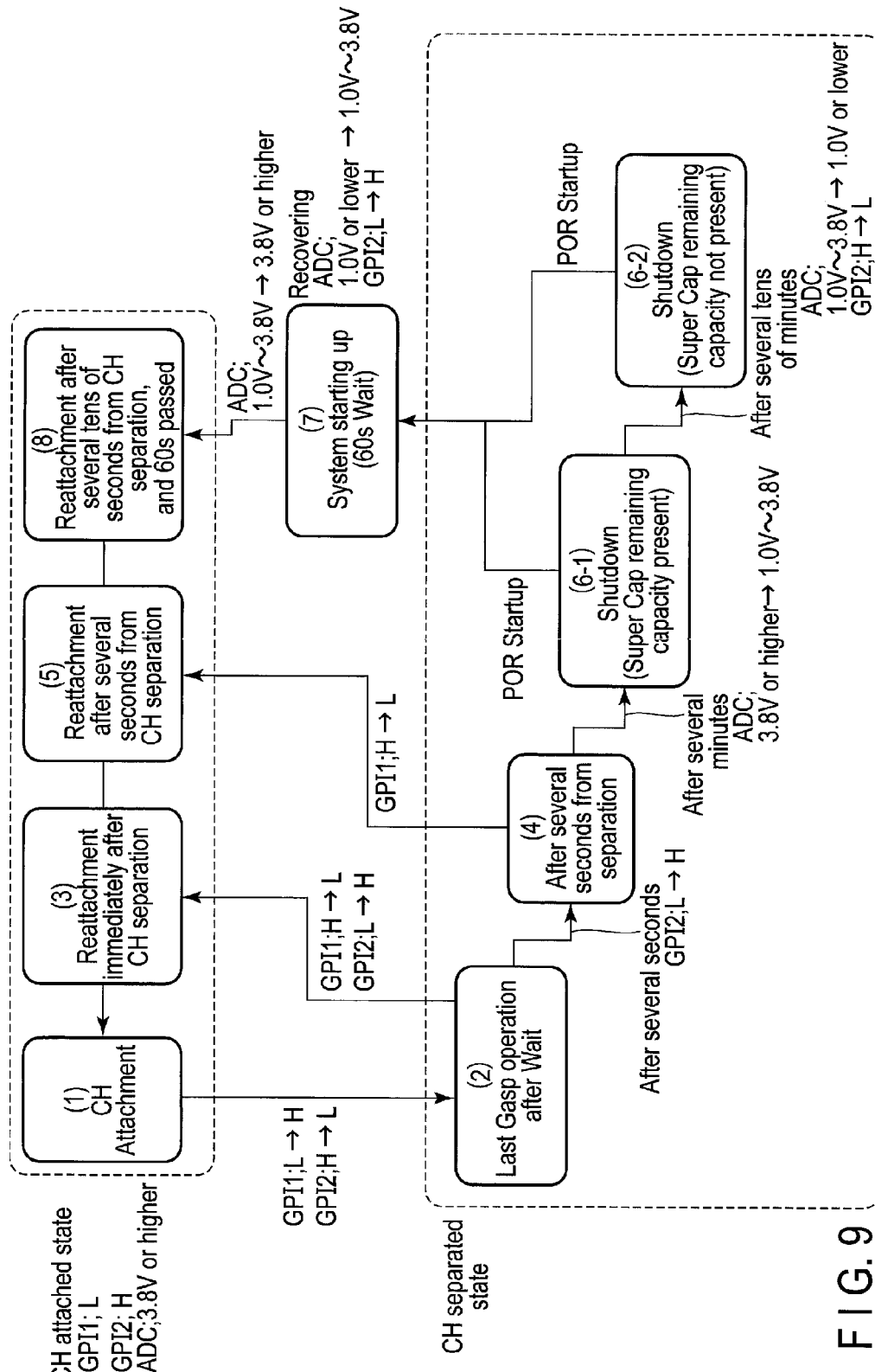
F I G. 9

| Tamper detection conditions | | Detecting pins | (1) CH Attachment | (2) Immediately after CH Separation | (3) Reattachment immediately after CH separation | (4) After several minutes from CH separation | (5) Reattachment after several seconds from CH separation | (6-1) After several minutes from CH separation | (6-2) After several tens of minutes from CH separation | (7) Reattachment after several tens of minutes from CH separation | (8) Reattachment after several tens of minutes from CH separation, and 60s passed |
|---|---|---|---|---|---|---|---|---|---|---|---|
| Detection of power failure (DC 12V) | ZigBee device 38 | GPI1 | L | L→H | H→L | H | H→L | L | L | Remains L | Remains L |
| Detection of Tamper (MT_PR) | ZigBee device 38 | GPI2 | H | H→L | L→H | H | Remains H | H | L | L→H | L→H |
| Confirmation of state | ZigBee device 38 | ADC | 3.8V or higher | 3.8V or higher | 3.8V or higher | 3.8V or higher | 3.8V or higher | 1.0V~3.8V | 1.0V or lower | 1.0V~3.8V | 3.8V or higher |
| ZigBee power | ZigBee device 38 | VCC | 3.3V | 3.3V | 3.3V | 3.3V | 3.3V | 3.3V | 0V | 3.3V(POR) | 3.3V |
| Action | | | Wait interrupt event | Notify Tamper detection and Last Gasp | Notify Tamper recovery | | Notify Tamper recovery | Shutdown after ending of Last Gasp | G3 state | Start counting 60 seconds after POR | System startup & notify Tamper recovery |

F I G. 10

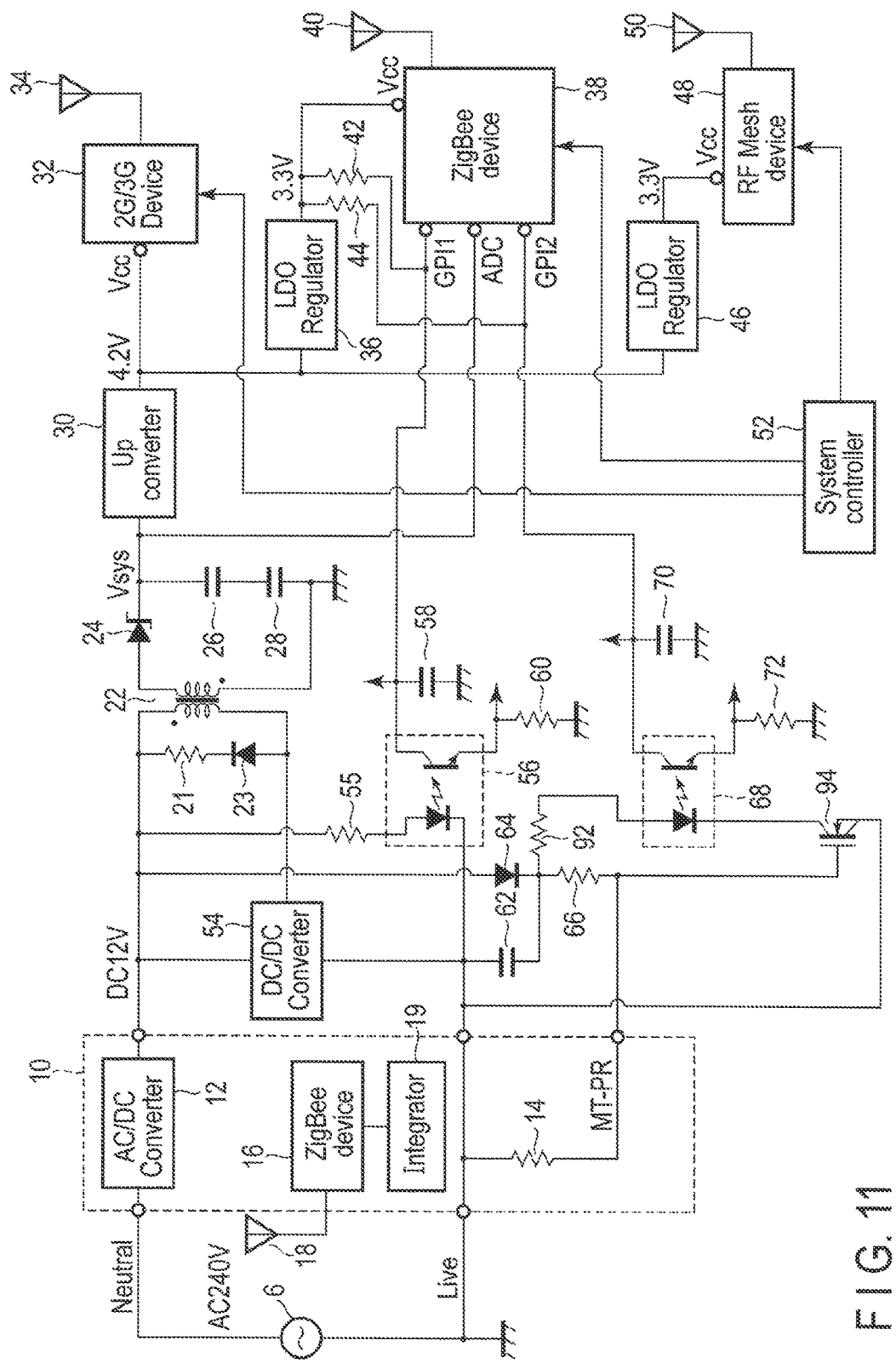
F I G. 11

ELECTRONIC DEVICE

CROSS-REFERENCE TO RELATED APPLICATIONS

This application is a Continuation application of PCT Application No. PCT/JP2014/081239, filed Nov. 26, 2014, the entire contents of which are incorporated herein by reference.

FIELD

Embodiments described herein relate generally to an electronic device connectable to other devices and operated with voltage supplied from the other devices.

BACKGROUND

Examples of such a device include a communication hub for a power meter used in a smart meter system. In the smart meter system, reading data of the power meter needs to be transmitted to a server on the network (for example, an electric power company). For this reason, attachment of a communication hub including a communication function with the network, to a power meter has been reviewed. Since a power meter is often installed outdoors, the communication hub attached to the meter may not include the power supply and may be operated with the power of the power meter. A terminal supplying a drive voltage from the power meter to the communication hub is provided at a connector of the power meter and the communication hub. If the communication hub attached to the power meter is detachable, the communication hub may be removed from the power meter by mischief. Alternatively, even if the communication hub is firmly attached to the power meter without considering the removal, the communication hub may be forcibly removed from the power meter for the purpose of falsification or the like. For this reason, removal of the communication hub from the power meter is desired to be detected. In addition, since the communication hub is required to be operated at any time, shutdown of power supply from the power meter caused by a power failure also needs to be detected.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 shows an example of a circuit configuration of an electronic device of embodiments.

FIG. 2 is a timing chart showing an example of power failure and recovery detection in a case where a remaining capacity of a super-capacitor is sufficient.

FIG. 6 is a state matrix showing an example of a state of each terminal at removal and power failure.

FIG. 8 shows an example of definitions of states of the communication hub when the power failure occurs.

FIG. 9 illustrates an example of a state transition diagram of the communication hub when removed from the power meter.

FIG. 10 shows an example of definitions of states of the communication hub when removed from the power meter.

FIG. 11 shows an example of a circuit configuration of an electronic device of another embodiment.

DETAILED DESCRIPTION

Figure 3:
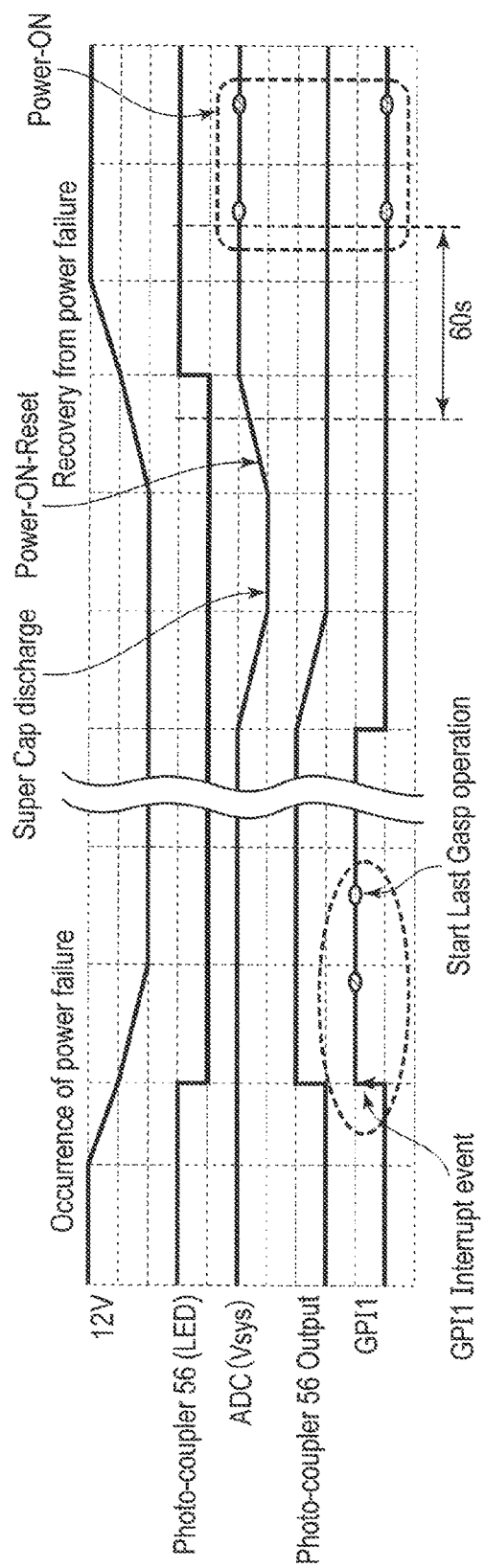
FIG. 3 is a timing chart showing an example of power failure and recovery detection in a case where the remaining capacity of the super-capacitor is small.

Various embodiments will be described hereinafter with reference to the accompanying drawings.

In general, according to one embodiment, an electronic device is attachable to an external power supply device and operable with a voltage from the external power supply device. The electronic device includes a transformer supplied with the voltage from the external power supply device; an electric double-layer capacitor chargeable with an output voltage of the transformer; a voltage converter connected to an output of the transformer; a processor having a power supply terminal supplied with an output voltage of the voltage converter; first and second photo-couplers supplied with the voltage from the external power supply device; and a capacitor connected to a primary side of the second photo-coupler through a resistor. The primary side of the second photo-coupler is grounded via a pull-down resistor inside the external power supply device. The processor includes first and second terminals supplied with outputs of the first and second photo-couplers and a third terminal supplied with a charging voltage of the electric double-layer capacitor, and configured to detect occurrence of power failure or detachment of the electronic device from the external power supply device in response to a combination of states of the first, second and third terminals.

A communication hub for a power meter used in a smart meter system will be explained as the embodiments but is not limited to this. Any device connected to another device and operated with a power source voltage supplied from the other device can be employed and the embodiments are not limited to a communication hub.

FIG. 1 is a diagram showing an example of a circuit configuration related to a power supply of the communication hub. Details of functions other than the power supply, for example, a communication function are omitted in the figure. Since the communication hub is a different body from the power meter 10 and is retrofitted to the power meter 10, the communication hub may be configured to be removable with a connector. However, the communication hub may be firmly attached to the power meter 10 in a state of being undetachable on a manufacturer's side. When the communication hub is mounted properly to the power meter, power is supplied from the power meter 10 to the communication hub via a terminal of a connector which makes connection between the communication hub and the power meter. A general commercial power supply (for example, AC 200V or 100V in Japan and 240V in the United Kingdom) 6 is applied to the power meter 10. A power line of the commercial power supply 6 includes, for example, a neutral line of AC 240V and a non-insulated live line of the ground level.

The power meter 10 includes an AC/DC converter 12, a pull-down resistor 14 for tamper detection, a ZigBee device 16, an antenna 18, an integrator 19 and the like. An AC voltage is supplied from the neutral line to the AC/DC converter 12, and the AC voltage is converted into a DC voltage (for example, DC 12V) and supplied to the communication hub via a connector as the power. The live line is connected to a ground line of the communication hub through the power meter 10. A tamper detection terminal MT_PR is provided at a connector between the power meter 10 and the communication hub, besides a DC 12V terminal and a live line terminal. The tamper detection terminal MT_RR of the communication hub is connected to the live line via the pull-down resistor 14 (for example, 10Ω), inside the power meter 10.

An electric device (not shown) is connected to a home interconnect. The home interconnect is connected to the power meter 10. An integrated value of power consumption of the electric device is obtained by the integrator 19. An integrated power is transmitted to the communication hub by using the ZigBee device 16 and the antenna 18. The communication hub is attached to the power meter 10 and is supplied with the power supply voltage from the power meter 10 via the connector, but the meter reading data (integrated power) of the power meter 10 is not transmitted to the communication hub via the connector but is transmitted from the power meter 10 to the communication hub by wireless communication of the ZigBee standard. However, the transmission is not limited to the above structure, but the meter reading data of the power meter 10 may be transmitted to the communication hub via the connector.

It should be noted that, for example, gas consumption data from a gas meter and water consumption data from a water meter, other than the power meter in the home, are also transmitted from ZigBee devices in the respective meters to the communication hub. In other words, the communication hub can aggregate the meter reading data from not only the power meter, but also the various meters and transmit the data to the network side periodically (for example, at intervals of thirty minutes). However, the transmission is not limited to the above structure, but the meter reading data of the power meter 10 alone may be transmitted to the communication hub via the connector, and the communication hub may transmit the meter reading data of the power meter 10 alone to the network side by wireless communication of the ZigBee standard.

The DC voltage of, for example, 12V supplied from the power meter 10 to the communication hub is transformed via the transformer 22, and is output via a diode 24 as $V_{sys}$ voltage of, for example, 4.2V. Both ends of primary winding of the transformer 22 are connected to each other via a resistor 21 and a diode 23. A DC/DC converter 54 is also connected to the primary side of the transformer 22 and the DC 12V is also supplied to the DC/DC converter 54. Both ends of secondary winding of the transformer 22 are connected to each other via electric double-layer capacitors 26 and 28 (hereinafter referred to as super-capacitors) in series and the output voltage $V_{sys}$ of the transformer 22 is charged to the large-capacity super-capacitors 26 and 28. One of ends of the super-capacitor 26 is connected to the diode 24 and one of ends of the super-capacitor 28 is grounded. For example, each of the super-capacitors 26 and 28 has the capacity of 25 F and the capacity of the super-capacitors 26 and 28 connected in series is 12.5 F. This capacity is set at a value at which even if the supply of DC 12V to the communication hub 20 is cut off, the output voltage $V_{sys}$ of the transformer 22 can be kept for a certain period.

The communication hub includes a plurality of, for example, three wireless communication devices, for example, a 2G/3G device 32, the ZigBee device 38 and an RF mesh device (wireless multi-hop system of IEEE 802.15.4) 48. Of these devices, the ZigBee device 38 is configured to receive the meter reading data from various meters, and the 2G/3G device 32 and the RF mesh device 48 are configured to transmit the meter reading data received from the various meters to the network side. The 2G/3G device 32 is configured to conduct communication using a mobile telephone line and is mainly employed in a suburb and a region in which houses are not located densely. The RF mesh device 48 is configured to conduct hop communication between the meters (communication hub) and is mainly employed in the urban area where houses are located densely. The communication with the network is not limited to wireless communication but may be communication using a power line. The communication using the power line is mainly used in condominiums, buildings and the like. A device used for communication with the network is selected in accordance with environment.

An operating voltage of the 2G/3G device 32 is in a range of 3.4V to 4.2V (Typ: standard voltage is 3.8V) but the operating voltage of the ZigBee device 38 and the RF mesh device 48 is 3.3V (Typ). Since the voltage of the super-capacitor is reduced from 4.2V in a case where DC 12V is cut off by occurrence of a power failure or the like, the output $V_{sys}$ of the transformer 22 is boosted to, for example, DC 4.2V, via an up-converter 30 and supplied to the power supply terminal Vcc of the 2G/3G device 32. The 2G/3G device 32 transmits the meter reading data to, for example, the server of the electric power company by conducting communication with a base station of cellular telephone communication via an antenna 34.

The output $V_{sys}$ of the transformer 22 is transformed to 3.3V via an LDO (Low Drop Out) regulator 36 and supplied to a power supply terminal Vcc of the ZigBee device 38. The ZigBee device 38 receives the meter reading data from various meters by conducting communication with various meters via the antenna 40.

The output $V_{sys}$ of the transformer 22 is transformed to 3.3V via an LDO regulator 46 and supplied to a power supply terminal Vcc of the RF mesh device 48. The RF mesh device 48 hops communication with the other communication hub via the antenna 50 and transmits the meter reading data to a concentrator.

A system controller 52 is connected to the 2G/3G device 32, the ZigBee device 38 and the RF mesh device 48 and transmission and reception of the meter reading data is thereby controlled. For example, the meter reading data received from various meters by the ZigBee device 38 is transmitted from the 2G/3G device 32 or the RF mesh device 48 to the network side under control of the system controller 52.

The communication hub is designed to be operated for thirty seconds from start of the occurrence of a power failure and notify the network of the occurrence of the power failure during this period. For this reason, the capacities of the super-capacitors 26 and 28 are determined such that $V_{sys}$ can be maintained for thirty seconds even if the supply of DC 12V from the power meter 10 is cut off. The communication hub can perform Last Gasp operation and notify the network side of the occurrence of a power failure by using the 2G/3G device 32 or the RF mesh device 48, for thirty seconds. The network side can take an appropriate measure when it is notified of the occurrence of the power failure. After the communication hub notifies the network side of the occurrence of power failure, the communication hub may stop operation. Since the power failure occurs in an area and since a number of communication hubs in the area simultaneously transmit the information to the network at the power failure, the network is congested and retry is required. Retry is permitted up to three times and thirty seconds are required for three retries.

Since the communication hub is often installed outdoors similarly to the power meter 10, using a battery as the power supply to ensure the operation for thirty seconds after the power failure has problems in terms of security and long-term reliability. These fears can be reduced since a battery is not used but the electric double-layer capacitors 26 and 28 called super-capacitors or ultra-capacitors having a large capacity which are passive components are used in the present embodiments.

Since power failure detection/tamper detection use the variation in the power supply voltage supplied from the power meter 10, these detections are performed by any one of the communication devices. An example of performing the power failure detection/tamper detection by the ZigBee device 38 will be explained here. By modifying the other devices similarly, the detection can be performed by the other devices. The ZigBee device 38 includes a $GPI_1$ terminal, a $GPI_2$ terminal and an ADC terminal for the power failure detection/tamper detection.

Since the voltage from the power meter 10 is a non-insulated voltage, a circuit for implementing the above-explained detecting function of the communication hub is desired to be insulated from the power meter 10. For this reason, the output $V_{sys}$ of the transformer 22 is connected to the ADC terminal of the ZigBee device 38, DC 12V supplied from the power meter 10 is connected to the $GPI_1$ terminal and the $GPI_2$ terminal of the ZigBee device 38 via photo-couplers 56 and 68, respectively. The ZigBee device 38 is thereby insulated from the commercial power supply.

The LED of the photo-coupler 56 has an anode connected to the DC 12V line via a resistor 55 and a cathode connected to the live line. A collector of a phototransistor of the photo-coupler 56 is connected to the $GPI_1$ terminal and is grounded via a capacitor 58. An emitter of the phototransistor of the photo-coupler 56 is grounded via a resistor 60. The $GPI_1$ terminal is connected to the output voltage 3.3V of the LDO regulator 36 via a resistor 42.

Thus, DC 12 C on the primary side is inverted by the photo-coupler 56 and transmitted to the secondary side and its variation is detected by the $GPI_1$ terminal. At this time, the super-capacitors 26 and 28 are connected to the secondary side of the transformer 22 and, even if the supply of the power (DC 12V) is interrupted, the output voltage $V_{sys}$ of the transformer 22 is maintained for a certain period, and the ZigBee device 38 can continue the operation during the period and detect the change of the $GPI_1$ terminal from Low to High.

The anode of the LED of the photo-coupler 68 is connected to the tamper detection terminal MT_PR, and connected to the DC 12V line via a resistor 66 (for example, 510Ω) and a diode 64. A connection point of the resistor 66 and the diode 64 is connected to the live line via a capacitor 62 (for example, 22 μF). Since the tamper detection terminal MT_PR is connected to the live line via the pull-down resistor 14 in the power meter 10, the anode of the LED of the photo-coupler 68 is also connected to the live line via the pull-down resistor 14. A cathode of the LED of the photo-coupler 68 is connected to the live line. In other words, the pull-down resistor 14 is connected between the anode and the cathode of the LED of the photo-coupler 68. A collector of a phototransistor of the photo-coupler 68 is connected to the $GPI_2$ terminal and is grounded via a capacitor 70. An emitter of the phototransistor is grounded via a resistor 72.

The $GPI_2$ terminal is connected to the output voltage 3.3V of the LDO regulator 36 via a resistor 44.

Since the tamper detection terminal MT_PR is thus pulled down via the resistor 14 in the power meter 10 but pulled up to DC 12V via the resistor 66 on the primary side inside the communication hub, the tamper detection signal MT_PR is changed from Low to High when the communication hub is removed from the power meter 10. Even if the supply of power (DC 12V) is cut off by removal from the power meter 10, the tamper detection signal MT_PR can be kept high for a while since the capacitor 62 of 22 μF is connected between the connection point of the resistor 66 and the diode 64 and the live line.

DC 12 C of the primary side is inverted by the photo-coupler 68 and transmitted to the secondary side, and this change is detected by the $GPI_2$ terminal. At this time, the super-capacitor 26 and 28 are connected to the secondary side of the transformer 22 and, since the output voltage $V_{sys}$ of the transformer 22 is maintained for a certain period even in a situation that supply of the power (DC 12V) is interrupted, the ZigBee device 38 can continue the operation during this period and detect the change of the $GPI_2$ terminal from High to Low.

FIG. 2 and FIG. 3 are timing charts showing operations of detecting the power failure and the recovery from power failure. The power failure and the recovery from power failure are detected by using the charges of the super-capacitors 26 and 28 on the secondary side of the transformer 22, and the charge capacity is gradually reduced just after the occurrence of a power failure. For this reason, the detecting operations are different in a case where the remaining capacity of the charges of the super-capacitors 26 and 28 is sufficient and a case where the remaining capacity is small. FIG. 2 is a timing chart in a case of the recovery from power failure in a situation in which the remaining capacity of the charges is sufficient just after occurrence of a power failure, and FIG. 3 is a timing chart in a case of the recovery from power failure in a situation in which the time has passed since the occurrence of power failure and the remaining capacity of the charges is small.

FIG. 2 shows operations of recovering from power failure in a situation in which the remaining capacity of the super-capacitors 26 and 28 is sufficient and the $GPI_1$ terminal is kept High.

When a power failure occurs, the voltage of DC 12V line in the communication hub gradually decreases and, if the voltage falls below the threshold value, the photo-coupler 56 is turned off and LED stops light emission, since the capacitance is connected to the output terminal at the power meter 10. For this reason, the output of the photo-coupler 56 is changed from Low to High and the $GPI_1$ terminal is changed from Low to High. When the $GPI_1$ terminal is changed from Low to High, the ZigBee device 38 detects interruption and then monitors the state of the $GPI_1$ terminal for a predetermined period, for example, every one second and, if High continues at two times, starts the Last Gasp operation of reporting the power failure detection to the network side. More specifically, the ZigBee device 38 reports the power failure detection to the system controller 52. The system controller 52 reports the power failure detection to a server of the electric power company on the network side by using the 2G/3G device 32 or the RF mesh device 48. The electric power company receiving this can start a recovery work and reduce the time for the recovery from power failure.

It should be noted that a power failure is not detected immediately based on the change of the $GPI_1$ terminal from Low to High to reduce the possibility of detection error based on an unstable operation. For this reason, if the operation is stable, a power failure may be detected immediately by interrupt detection. In addition, if a power failure is not detected immediately by an interrupt detection, the number of times of detection of High is not limited to two times, but may be one time or three times or more, and the detection interval is not limited to one second but may be an arbitrary interval (including an inconstant interval).

If the power is recovered from a power failure and the DC 12V line rises to the threshold value or higher, the photo-coupler 56 is turned on, its output becomes Low, and the $GPI_1$ terminal is changed from High to Low. When the $GPI_1$ terminal is changed from High to Low, the ZigBee device 38 detects the interruption, then monitors the state of the $GPI_1$ terminal and the state of the ADC terminal supplied with $V_{sys}$ for a predetermined period, for example, every one and half seconds. If monitoring $GPI_1$=Low and ADC=High (where $V_{sys}$ maintains High until recovery from the power failure by charges of the super-capacitors 26 and 28) continues two times, the ZigBee device 38 notifies the network side of power-on to inform the recovery from power failure. This recovery detection may also be detected immediately by interrupt, similarly to the power failure detection and, if the recovery is detected at a plurality of times, the number of times of the detection and the like can be varied appropriately.

FIG. 3 shows operations in a case of recovering in a situation in which a long time has passed until the recovery from power failure, the charges of the super-capacitors 26 and 28 are reduced during power failure, and $V_{sys}$ is changed to Low.

At the occurrence of power failure, the voltage of DC 12V line is reduced to a threshold value or lower, the $GPI_1$ terminal is changed from Low to High and the state of the terminal $GPI_1$ is monitored per second. If High continues twice, the Last Gasp operation of reporting the detection of power failure to the network side starts, similarly to the case of FIG. 2. $V_{sys}$ is maintained High by the charges of the super-capacitors 26 and 28 until the power is recovered in the case of FIG. 2, but $V_{sys}$ is lowered before the recovery and the ADC terminal is changed to Low in the case of FIG. 3.

After that, the recovery from power failure is executed, the voltage of DC 12V line rises and $V_{sys}$ also rises. If $V_{sys}$ becomes a threshold value (for example, 3.8V) or higher, it can be determined that the voltage of the super-capacitors 26 and 28 is normally charged, the power-on reset operation is performed, and the system is restarted.

Since the phototransistor of the photo-coupler 56 is pulled up to the $V_{sys}$, the LED of the photo-coupler 56 is turned on but its output remains Low and the $GPI_1$ terminal also remains Low when the system is turned on to examine the level of the terminal $GPI_1$ after DC 12V is restored and $V_{sys}$ is recovered. For this reason, the change of $GPI_1$ terminal from High to Low cannot be detected as a trigger for detection of the recovery from power failure, unlike the case of FIG. 2. Thus, in this case, after a power-on reset operation and after passage of a predetermined time, for example, sixty seconds or more, the ZigBee device 38 monitors the state of the $GPI_1$ terminal and the state of the ADC terminal supplied with $V_{sys}$. If $GPI_1$=Low and ADC=High, the ZigBee device 38 reports power-on to the network side.

In other words, the ZigBee device 38 starts monitoring the state of $GPI_1$ terminal when the $GPI_1$ terminal is changed from Low to High. When the ZigBee device 38 detects High of the $GPI_1$ terminal a predetermined number of times, the ZigBee device 38 detects the power failure and reports the detection of power failure to the network side. When the power is restored and the $GPI_1$ terminal is changed from High to Low, the ZigBee device 38 starts monitoring the state of the $GPI_1$ terminal and the state of the ADC terminal supplied with $V_{sys}$. When the ZigBee device 38 detects $GPI_1$=Low and ADC=High at a predetermined number of times, the ZigBee device 38 reports power-on to the network side. The ZigBee device 38 performs the above operation if the time from the occurrence of power failure to the recovery from power failure is short and if the power is recovered while the drive voltage of 3.3V generated based on $V_{sys}$ is supplied to the ZigBee device 38. However, the ZigBee device 38 cannot detect the change of the $GPI_1$ terminal from High to Low if the time from the occurrence of power failure to the recovery from power failure is long and if the drive voltage of the ZigBee device 38 is interrupted before the power is restored. In this case, the ZigBee device 38 monitors the states of the $GPI_1$ terminal and the ADC terminal after a predetermined time has passed since recovery of the power and power-on reset and, if $GPI_1$=Low and ADC=High continues two times, reports the power-on to the network side.

In other words, the ZigBee device 38 can detect the occurrence of power failure if the ZigBee device 38 detects the situation that the $GPI_1$ terminal is High twice after a predetermined time has passed since the change of the $GPI_1$ terminal from Low to High. The ZigBee device 38 can detect the recovery from power failure if the ZigBee device 38 detects the situation that the $GPI_1$ terminal is Low and the ADC terminal is High twice after a predetermined time has passed since the change of the $GPI_1$ terminal from High to Low or after a predetermined time has passed since the power-on reset. The number of times of detection is not limited to two, but may be one time or three or more times.

Figure 4:
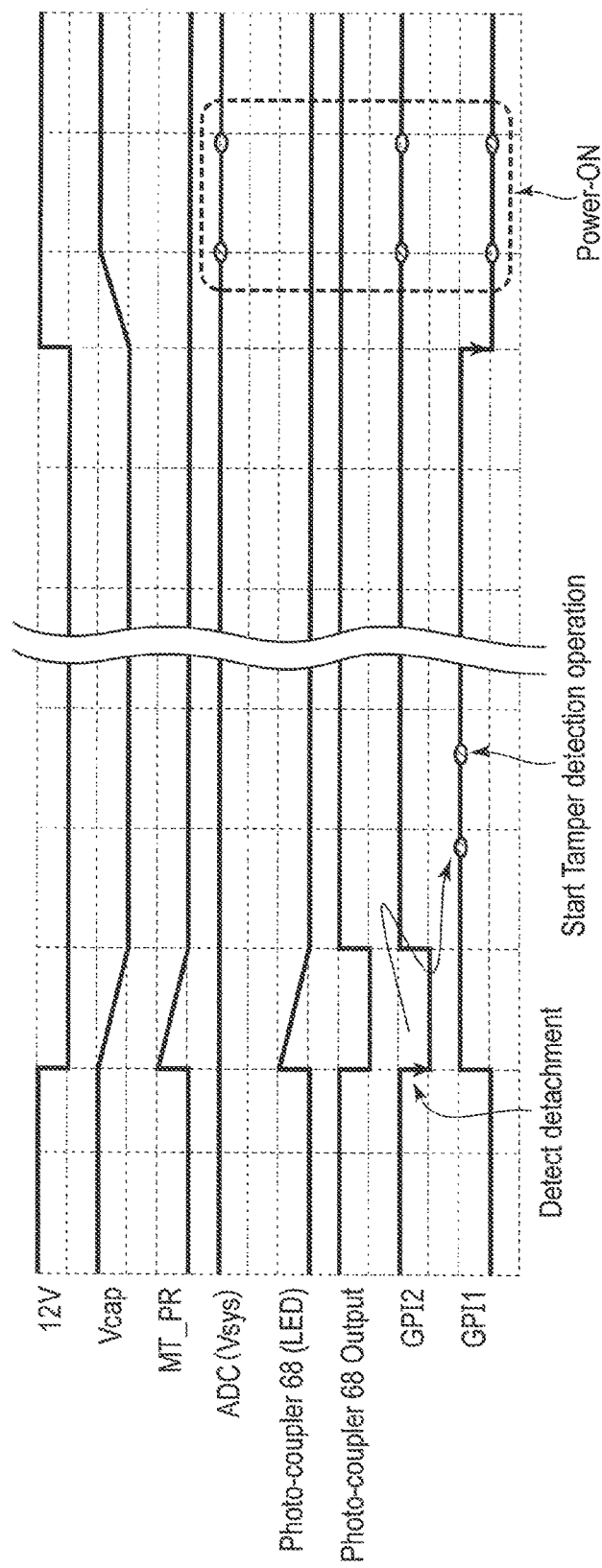
FIG. 4 is a timing chart showing an example of tamper and recovery detection in a case where the remaining capacity of the super-capacitor is sufficient.
Figure 5:
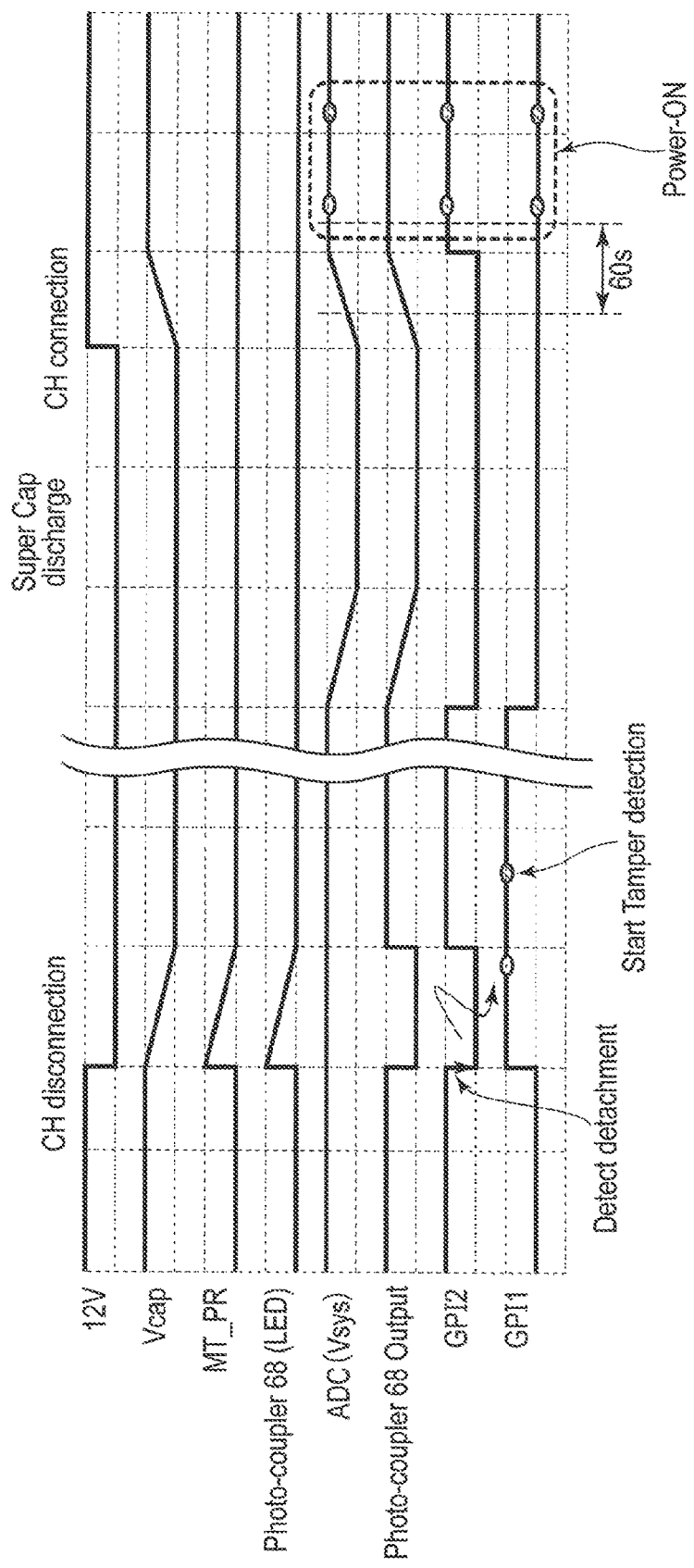
FIG. 5 is a timing chart showing an example of tamper and recovery detection in a case where the remaining capacity of the super-capacitor is small.

FIG. 4 and FIG. 5 are timing charts for tamper detection and reattachment detection in a case where the communication hub is detached from the power meter 10. The state of the $GPI_2$ terminal is changed in accordance with the remaining charge capacity of the super-capacitors 26 and 28, similarly to the detection of power failure. FIG. 4 is a timing chart in a case where reattachment is performed in a state in which the remaining capacity is sufficient immediately after the detachment, and FIG. 5 is a timing chart in a case where reattachment is performed in a state in which a time has passed since the detachment and the remaining capacity is small.

FIG. 4 shows a case where reattachment is performed in a state in which the remaining capacity of the super-capacitors 26 and 28 is sufficient and the $GPI_2$ terminal remains High.

When the communication hub is detached from the power meter 10, the supply of DC 12V from the power meter 10 is also interrupted, and the state of the tamper detection signal MT_PR is changed from Low to High by the charge of the capacitor 62 on the primary side of the photo-coupler 68. This change is inverted by the photo-coupler 68 and transmitted to the $GPI_2$ terminal, and the state of the $GPI_2$ terminal is changed from High to Low. The ZigBee device 38 monitors the state of the $GPI_1$ terminal for a predetermined period, for example, every one second after the tamper detection terminal $GPI_2$ is changed from High to Low and, if High continues two times, reports the tamper detection (detachment detection) to the network side. The network side can take an appropriate measure when the network side is notified of the tamper detection.

After changing from Low to High, the state of the tamper detection signal MT_PR is reduced gradually due to the discharge of the capacitor 62 on the primary side of the photo-coupler 68. The light emission amount of the LED of the photo-coupler 68 is also reduced in accordance with the reduction of the tamper detection signal MT_PR. A period in which the tamper detection signal MT_PR reduces from High to Low is 88 ms (=22 µF×12V/3 mA) if the current flowing through the photo-coupler 68 is 3 mA. When the light emission amount of the LED of the photo-coupler 68 runs out, the output of the photo-coupler 68 returns to High and the $GPI_2$ terminal also becomes High. However, the state of the $GPI_2$ terminal is not used for determination of detection since a certain state maintaining period may not be able to be secured due to variations in hardware.

When the communication hub is reattached to the power meter 10 again after detachment from the power meter 10, the supply of DC 12V is restarted, the photo-coupler 56 is turned on, their outputs become Low, and the $GPI_1$ terminal is changed from High to Low. The ZigBee device 38 monitors the state of the $GPI_1$ terminal, the state of the $GPI_2$ terminal and the state of the ADC terminal supplied with $V_{sys}$ for a predetermined period, for example, every one and half seconds after the $GPI_1$ terminal is changed from High to Low. If $GPI_1$=Low, $GPI_2$=High, and ADC=High (where $V_{sys}$ maintains High after detachment until reattachment by charges of the super-capacitors 26 and 28) continues two times, the ZigBee device 38 notifies the network side of power-on to inform the reattachment.

FIG. 5 shows operations in a case of reattachment in a situation in which a long time has passed since detachment and until reattachment, the charges of the super-capacitors 26 and 28 are reduced during the detachment, and $V_{sys}$ is changed to Low.

When the communication hub is detached from the power meter 10, the state of the tamper detection signal MT_PR is changed from Low to High, similarly to the case of FIG. 4. This change is inverted by the photo-coupler 68 and transmitted to the $GPI_2$ terminal, and the state of the $GPI_2$ terminal is changed from High to Low. The ZigBee device 38 monitors the state of the terminal $GPI_1$ for a predetermined period, for example, every one second after the tamper detection terminal $GPI_2$ is changed from High to Low and, if High continues two times, reports the tamper detection to the network side.

When a long time has passed since the detachment from the power meter 10, the charges of the super-capacitors 26 and 28 are discharged, $V_{sys}$ is reduced, and the ADC terminal is changed to Low. When the communication hub is reattached to the power meter 10 in this state, the supply of DC 12V is restarted, the capacitor 62 is charged, and $V_{sys}$ is gradually increased. If $V_{sys}$ becomes a threshold value (for example, 3.8V) or higher, it can be determined that the voltage of the super-capacitors 26 and 28 is normally charged, the power-on reset operation is performed, and the system is restarted.

The LED of the photo-coupler 56 is turned on by the restart of the system, but its output remains Low and the $GPI_1$ terminal also remains Low. For this reason, the change of $GPI_1$ terminal from High to Low cannot be detected as a trigger for the detection of reattachment, unlike the case of FIG. 4. Thus, in this case, after a power-on reset operation and after passage of a predetermined time, for example, sixty seconds or more, the ZigBee device 38 monitors the state of the $GPI_1$ terminal and the state of the $GPI_2$ terminal and, if $GPI_1$=Low, $GPI_2$=High and ADC=High continue two times, reports the reattachment to the network side.

In other words, the ZigBee device 38 starts monitoring the state of $GPI_1$ terminal when the $GPI_2$ terminal is changed from High to Low. When the ZigBee device 38 detects High of the $GPI_1$ terminal a predetermined number of times, the ZigBee device 38 detects the detachment and reports the detection of detachment to the network side. When the communication hub is reattached and the $GPI_1$ terminal is changed from High to Low, the ZigBee device 38 starts monitoring the state of the $GPI_1$ terminal, the state of the $GPI_2$ terminal and the state of the ADC terminal supplied with $V_{sys}$. When the ZigBee device 38 detects $GPI_1$=Low, $GPI_2$=High and ADC-High at a predetermined number of times, the ZigBee device 38 reports the reattachment to the network side. The ZigBee device 38 performs the above operation if the time from the detachment to the reattachment is short and if the reattachment is performed while the drive voltage of 3.3V generated based on $V_{sys}$ is supplied to the ZigBee device 38, but the ZigBee device 38 cannot detect the change of the $GPI_1$ terminal from High to Low if the drive voltage of the ZigBee device 38 is interrupted before the reattachment. In this case, as shown in FIG. 5, the ZigBee device 38 monitors the states of the $GPI_1$ terminal and the $GPI_2$ terminal after a predetermined time has passed since the reattachment and the power-on reset. When the ZigBee device 38 detects $GPI_1$=Low and $GPI_2$=High at a predetermined number of times, the ZigBee device 38 reports the reattachment to the network side.

In other words, the tamper detection is performed in a case where $GPI_1$ terminal is High after a predetermined time has passed since the change of the $GPI_2$ terminal from High to Low. The ZigBee device 38 can detect the reattachment if the $GPI_1$ terminal is Low and the $GPI_2$ terminal is High after a predetermined time has passed since change of the $GPI_1$ terminal from High to Low or after a predetermined time has passed since the power-on reset.

FIG. 6 shows a state matrix of the $GPI_1$ terminal, the $GPI_2$ terminal, and the ADC terminal at the time of power failure and recovery from power failure, and the detection of detachment (tamper) and reattachment. CH denotes a communication hub. The $GPI_1$ terminal is Low when supplied with DC 12V from the power meter 10 or High when not supplied with DC 12V. The $GPI_2$ terminal is High when the communication hub is attached to the power meter 10 or Low when the communication hub is detached from the power meter 10. The ADC terminal is for determining whether the super-capacitors 26 and 28 are capable of normally charging, and its threshold value is 3.8V. The Vcc terminal is 0V or 3.3V.

Figure 7:
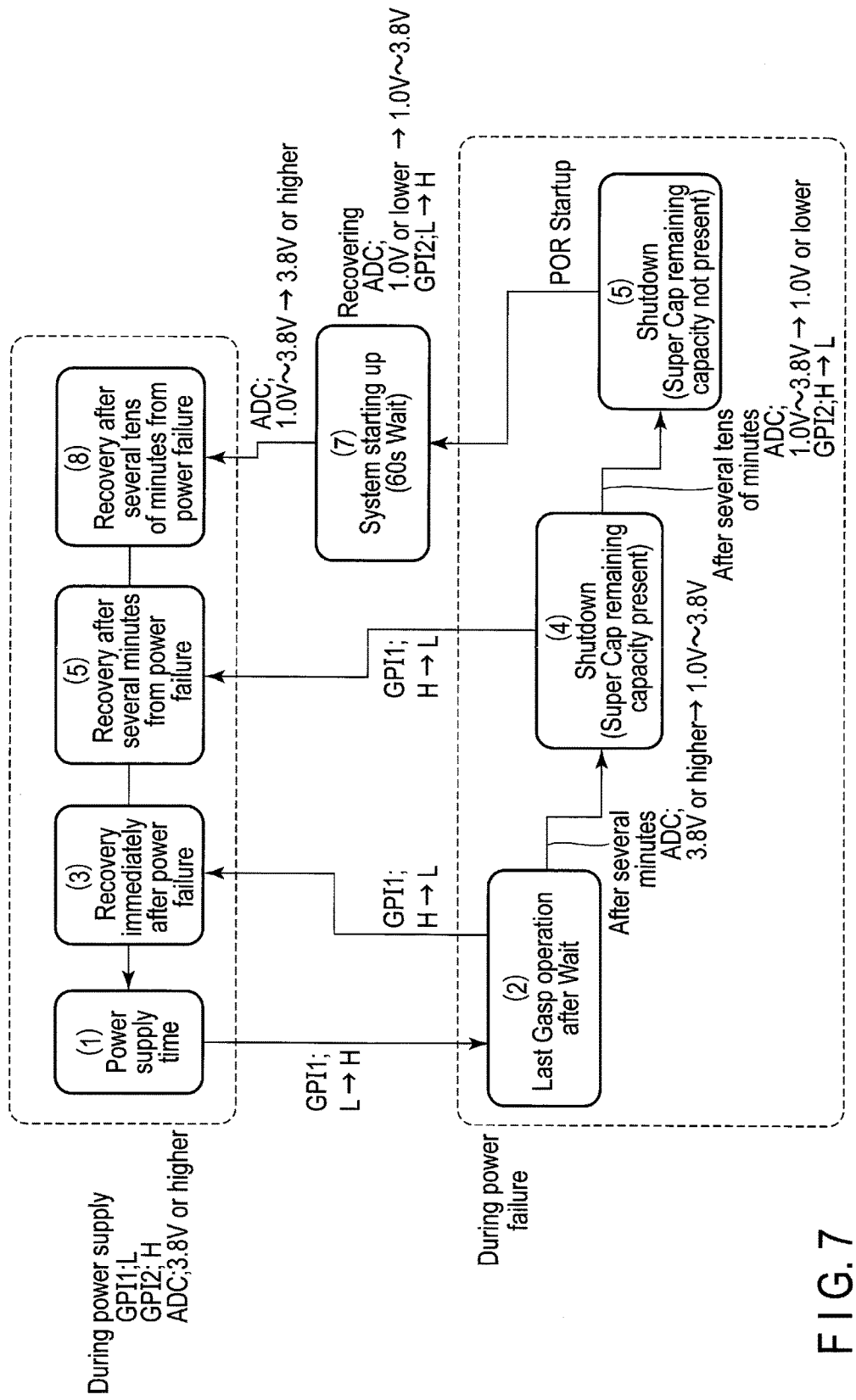
FIG. 7 illustrates an example of a state transition diagram of the communication hub when the power failure occurs.

FIG. 7 shows a state transition diagram of the detection of power failure and recovery. FIG. 8 shows a definition of each of the states in FIG. 7. In FIG. 7, states are classified into eight states explained below. (1) Normal power supply, (2) state immediately after power failure, (3) state in which the power is recovered immediately after power failure, (4) state in which several minutes have passed since power failure, (5) state in which the power is recovered after several minutes have passed since power failure, (6) state in which several tens of minutes have passed since power failure, (7) state in which the power is recovered after several tens of minutes have passed since power failure, and (8) state in which the power is recovered after several tens of minutes have passed since power failure and then sixty seconds pass.

Two states of (2) state immediately after power failure and (4) state in which several minutes have passed since power failure are the states in which the remaining charges of the super-capacitors 26 and 28 are left, but the voltage level of $V_{sys}$ may be or may not be below the determination threshold value.

Four states of (1) normal power supply, (3) state in which the power is recovered immediately after power failure, (5) state in which the power is recovered after several minutes have passed since power failure, and (8) state in which the power is recovered after several tens of minutes have passed since power failure and then sixty seconds pass, are the power supply states and have the same conditions, but are classified into four states for convenience of showing the state transition diagram.

During the power supply, the $GPI_1$ terminal is Low, the $GPI_2$ terminal is High, and the ADC terminal is 3.8V or higher. If a power failure occurs during the power supply, the $GPI_1$ terminal is changed from Low to High, and (1) the normal power supply transitions to (2) state immediately after power failure. The Last Gasp operation is performed (2) state immediately after power failure but, if the recovery from power failure is performed before that, the $GPI_1$ terminal is changed from High to Low, and the state (2) state immediately after power failure transitions to (3) state in which the power is recovered immediately after power failure.

The Last Gasp operation is performed (2) state immediately after power failure and, when several minutes have passed, the ADC terminal becomes in a range of 1.0V to 3.8V, and (2) state immediately after power failure transitions to (4) state in which several minutes have passed since power failure. If the power is recovered from the power failure in this state, the $GPI_1$ terminal is changed from High to Low and (4) state in which several minutes have passed since power failure transitions to (5) state in which the power is recovered after several minutes have passed since power failure.

If several tens of minutes have further passed in (4) state in which several minutes have passed since after power failure, the ADC terminal becomes 1.0V or lower, the $GPI_2$ terminal is changed from High to Low, and (4) state in which several minutes have passed since power failure transitions to (5) state in which the power is recovered after several minutes have passed since power failure. If the power is recovered in this state, the power-on reset (POR) operation is performed, and (5) state in which the power is recovered after several minutes have passed since power failure transitions to (7) state in which the power is recovered after several tens of minutes have passed since power failure (the system is starting up). During the system startup, the ADC terminal is in a range of 1.0V to 3.8V and the $GPI_2$ terminal is changed from Low to High.

When sixty seconds have passed since the system startup, the state transitions to (8) state in which the power is recovered after several tens of minutes have passed since power failure and then sixty seconds pass, and the ADC terminal becomes 3.8V or higher.

FIG. 9 shows a state transition diagram at the time of tamper detection and reattachment detection. FIG. 10 shows a definition of each of the states in FIG. 9. In FIG. 9, states are classified into eight states explained below. (1) State in which the communication hub is attached to the power meter, (2) state in which the communication hub is detached from the power meter, (3) state in which the communication hub is reattached to the power meter immediately after detachment, (4) state in which several seconds have passed since detachment of the communication hub from the power meter, (5) state in which the communication hub is reattached to the power meter, which transitions from the state in which several seconds have passed since detachment of the communication hub from the power meter, (6-1) state in which several minutes have passed since detachment of the communication hub from the power meter (the remaining capacity of the super-capacitors 26 and 28 is sufficient), (6-2) state in which several tens of minutes have passed since detachment of the communication hub from the power meter (the remaining capacity of the super-capacitors 26 and 28 is hardly present), (7) state in which the communication hub is reattached to the power meter, which transitions from the state in which several minutes or several tens of minutes have passed since detachment of the communication hub from the power meter, and (8) state in which the communication hub is reattached to the power meter and sixty seconds further pass, which transitions from the state in which several tens of minutes have passed since detachment of the communication hub from the power meter.

Each of (2) state in which the communication hub is detached from the power meter, and (4) state in which several seconds have passed since detachment of the communication hub from the power meter indicates the state in which the remaining capacity of the super-capacitors 26 and 28 is left, and the voltage level of $V_{sys}$ may be or may not be below a determination threshold value.

Four states, i.e., (1) state in which the communication hub is attached to the power meter, (3) state in which the communication hub is reattached to the power meter immediately after detachment, (5) state in which the communication hub is reattached to the power meter, which transitions from the state in which several seconds have passed since detachment of the communication hub from the power meter, and (8) state in which the communication hub is reattached to the power meter and sixty seconds further pass, which transitions from the state in which several tens of minutes have passed since detachment of the communication hub from the power meter indicate the state in which the communication hub is attached, under the same conditions, but the states are thus classified into four states for convenience of showing a state transition diagram.

The $GPI_1$ terminal is Low, the $GPI_2$ terminal is High, and the ADC terminal is 3.8V or higher in the state in which the communication hub is attached to the power meter. If the communication hub is detached from the power meter, the $GPI_1$ terminal is changed from Low to High, the $GPI_2$ terminal is changed from High to Low, and (1) state in which the communication hub is attached to the power meter transitions to (2) state in which the communication hub is detached from the power meter. The Last Gasp operation is performed in (2) state in which the communication hub is detached from the power meter but, if the communication hub is reattached to the power meter before this, the $GPI_1$ terminal is changed from High to Low, the $GPI_2$ terminal is changed from Low to High, and (2) state in which the communication hub is detached from the power meter transitions to (3) state in which the communication hub is reattached to the power meter immediately after detachment.

If the Last Gasp operation is performed and several seconds pass in (2) state in which the communication hub is detached from the power meter, the $GPI_2$ terminal is changed from Low to High, and (2) state in which the communication hub is detached from the power meter transitions to (4) state in which several seconds have passed since detachment of the communication hub from the power meter. If the communication hub is reattached to the power meter, the $GPI_1$ terminal is changed from High to Low, and (4) state in which several seconds have passed since detachment of the communication hub from the power meter transitions to (5) state in which the communication hub is reattached to the power meter.

If several minutes further pass in (4) state in which several seconds have passed since detachment of the communication hub from the power meter, the ADC terminal is in a range of 1.0V to 3.8V, and (4) state in which several seconds have passed since detachment of the communication hub from the power meter transitions to (6-1) state in which several minutes have passed since detachment of the communication hub from the power meter (shut down) (the remaining capacity of the super-capacitors 26 and 28 is sufficient). If the communication hub is reattached to the power meter, the power-on reset operation is performed, and (6-1) state in which several minutes have passed since detachment of the communication hub from the power meter transitions to (7) state in which the communication hub is reattached to the power meter, which transitions from the state in which several minutes or several tens of minutes have passed since detachment of the communication hub from the power meter (the system is starting up). During the system startup, the ADC terminal is in a range of 1.0V to 3.8V and the $GPI_2$ terminal is changed from Low to High.

If sixty seconds pass after the system startup, the state transitions to (8) state in which the communication hub is reattached to the power meter and sixty seconds further pass, which transitions from the state in which several tens of minutes have passed since detachment of the communication hub from the electric power, and the ADC terminal becomes 3.8V or higher.

If several tens of minutes further pass in (6-1) state in which several minutes have passed since detachment of the communication hub from the power meter (shutdown), the ADC terminal becomes 1.0V or lower, the $GPI_2$ terminal is changed from High to Low, and the state transitions to (6-2) state in which several tens of minutes have passed since detachment of the communication hub from the power meter (the remaining capacity of the super-capacitors 26 and 28 is hardly present). If the communication hub is reattached to the power meter in this state, the power-on reset operation is performed, and (6-2) state in which several tens of minutes have passed since detachment of the communication hub from the power meter transitions to (7) state in which the communication hub is reattached to the power meter, which transitions from the state in which several minutes or several tens of minutes have passed since detachment of the communication hub from the power meter (the system is starting up).

As explained above, according to the embodiment, the DC voltage output from the power meter 10 is the power supply voltage of the communications device via the transformer 22. In the power meter, the tamper detection terminal MT_PR is connected to the ground line via the pull-down resistor. The communication device includes the $GPI_1$ terminal which receives the output of the photo-coupler 56 operated with the DC voltage, the $GPI_2$ terminal which receives the output of the photo-coupler 68 operated with the voltage of the tamper detection terminal MT_PR, and the ADC terminal which receives an output voltage of the transformer. The capacitor 62 charged with the DC voltage output from the power meter is connected to the primary side of the photo-coupler 68. The output of the transformer is connected to the super-capacitors 26 and 28 charged with its output voltage.

At the occurrence of power failure and the detachment of the communication hub, the DC voltage output from the power meter 10 is interrupted. However, the DC voltage is gradually decreased at the power failure, the DC voltage immediately becomes Low at the detachment.

It is determined whether the power failure occurs or not, by using the change of the $GPI_1$ terminal from Low to High as a trigger. More specifically, if it is detected that the $GPI_1$ terminal is High at a predetermined number of times, the occurrence of power failure is detected. Then, it is determined whether the power has been recovered or not, by using the passage of a certain period after the change of the $GPI_1$ terminal from High to Low or the power-on reset as a trigger. More specifically, if it is detected that the $GPI_1$ terminal is Low and that the ADC terminal is High, at a predetermined number of times, the recovery from the power failure is detected.

It is determined whether the communication hub has been detached or not, by using the change of the $GPI_2$ terminal from High to Low as a trigger. More specifically, if it is detected that the $GPI_1$ terminal is High at a predetermined number of times, the detachment is detected. Then, it is determined whether the communication hub has been reattached or not, by using passage of a certain period after the change of the $GPI_1$ terminal from High to Low or power-on reset as a trigger. More specifically, if it is detected that the $GPI_1$ terminal is Low, that the $GPI_2$ terminal is High and that the ADC terminal is High, at a predetermined number of times, the reattachment is detected.

Supply of the power from the power meter is stopped in both situations of the time of occurrence of power failure and the time of detachment of the communication hub (tamper), at the communication hub. The tamper detection terminal must be changed from Low to High (the $GPI_2$ terminal must be changed from High to Low) simultaneously with the detachment to identify the time of occurrence of power failure and the tamper time but, if supply of the voltage from the power meter to the voltage on the primary side of the transformer, the tamper detection terminal cannot be changed since the power supply does not exist. In the embodiment, however, since the capacitor 62 charged with the DC voltage output from the power meter is connected to the primary side of the photo-coupler 68 operated with the voltage of the tamper detection terminal MT_PR, the tamper detection terminal can be changed from Low to High even if supply of the power from the power meter is interrupted. Thus, if the DC voltage output from the power meter is interrupted, it can be discriminated whether the reason is the power failure or the detachment of the communication hub.

FIG. 11 is a circuit diagram of a modified example. In FIG. 1, the current path from the DC 12V line to the live line through the resistors 66 and 14 exists at any time and the power consumption often becomes a problem. The modified example capable of reducing the current is shown in FIG. 11. MOSFET 94 is connected to the photo-coupler 68 in series. One of ends of the MOSFET 94 is connected to a cathode of the LED of the photo-coupler 68, the other end is connected to the live line. A connection point between the resistor 66 and the resistor 14 is connected to a gate of the MOSFET 94. An anode of the LED of the photo-coupler 68 is connected to the connection point between the resistor 66 and the diode 64 via a resistor 92. The resistance value of the resistor 66 is 500Ω in FIG. 1 but can be 10 kΩ in FIG. 11. The resistance value of the resistor 14 is 10Ω similarly to FIG. 1. The resistance value of the added resistor 92 in FIG. 11 is 1 kΩ. By thus connecting the MOEFET 94 to the photo-coupler 68, the resistance value of the resistor 66 in the current path from the DC 12V line to the live line can be increased and the value of the current flowing from the DC 12V line to the live line can be reduced.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device connectable to an external power supply device and operated with a voltage from the external power supply device, the electronic device comprising:
    a transformer supplied with the voltage from the external power supply device;
    an electric double-layer capacitor charged with an output voltage of the transformer;
    a voltage converter connected to an output of the transformer;
    a processor comprising a power supply terminal supplied with an output voltage of the voltage converter;
    first and second photo-couplers supplied with the voltage from the external power supply device; and
    a capacitor connected to a primary side of the second photo-coupler through a resistor, wherein
    the primary side of the second photo-coupler is grounded via a pull-down resistor in the external power supply device, and
    the processor comprises first and second terminals supplied with outputs of the first and second photo-couplers and a third terminal supplied with a charging voltage of the electric double-layer capacitor, and configured to detect occurrence of power failure or detachment of the electronic device from the external power supply device in response to a combination of states of the first, second and third terminals.

2. The electronic device of claim 1, wherein
    the processor is configured to start determination of the occurrence of power failure in response to variation in level of the first terminal and to start determining whether the detachment is executed or not in response to variation in level of the second terminal.

3. The electronic device of claim 2, wherein
    the processor is configured to detect the occurrence of power failure or the detachment when the processor detects a state in which the level of the first terminal is a first level at a first number of times.

4. The electronic device of claim 1, wherein
    the processor is configured to start determining whether power is recovered from the power failure or not, or whether reattachment is executed or not in response to variation in level of the first terminal or power-on reset.

5. The electronic device of claim 4, wherein
    the processor is configured to detect a state in which the power is recovered from the power failure when the processor detects a state in which a level of the first terminal and a level of the third terminal are first levels at a first number of times, and
    the processor is configured to detect the reattachment when the processor detects a state in which the level of the first terminal, a level of the second terminal and a level of the third terminal are second levels at second number of times.

6. The electronic device of claim 1, wherein
    the external power supply device comprises a power meter, and the processor comprises a communication unit which is configured to conduct communication with the power meter, another meter or a network, to transmit a power failure detection result or a detachment detection result to the network and to transmit received meter reading data to the network.

7. A method for an electronic device connectable to a power supply device and operated with a voltage from the power supply device,
    the electronic device comprising:
    a transformer supplied with the voltage from the power supply device;
    an electric double-layer capacitor charged with an output voltage of the transformer;
    a voltage converter connected to an output of the transformer;
    a processor comprising a power supply terminal supplied with an output voltage of the voltage converter;
    first and second photo-couplers supplied with the voltage from the power supply device; and
    a capacitor connected to a primary side of the second photo-coupler through a resistor, wherein
    the primary side of the second photo-coupler is grounded via a pull-down resistor in the power supply device, and
    the processor comprises first and second terminals supplied with outputs of the first and second photo-couplers and a third terminal supplied with a charging voltage of the electric double-layer capacitor,
    the method comprising:
    detecting occurrence of a power failure or detachment of the electronic device from the power supply device in response to a combination of states of the first, second and third terminals.

8. The method of claim 7, comprising:
    starting determination of occurrence of a power failure in response to variation in level of the first terminal; and
    starting determining whether the detachment is executed or not in response to variation in level of the second terminal.

9. The method of claim 8, comprising:
    detecting the occurrence of power failure or the detachment when it is detected that the level of the first terminal is a first level at a first number of times.

10. The method of claim 7, comprising:
    starting determining whether power is recovered from the power failure or not, or whether reattachment is executed or not in response to variation in level of the first terminal or power-on reset.

11. The method of claim 10, comprising:
    detecting a state in which power is recovered from the power failure when it is detected that a level of the first terminal and a level of the third terminal are first levels at a first number of times, and
    detecting the reattachment when it is detected that the level of the first terminal, a level of the second terminal and a level of the third terminal are second levels at a second number of times.

12. The method of claim 7, wherein
    the power supply device comprises a power meter, and the processor comprises a communication unit which is configured to conduct communication with the power meter, another meter or a network, and the processor is configured to receive meter reading data from the power meter or the other meter, to transmit the received meter reading data to the network, and to transmit a power failure detection result or a detachment detection result to the network.

13. An electronic device, comprising:
a power supply device; and
a communication device attached to the power supply device, wherein the power supply device comprises:
   a first transceiver configured to communicate with the communication device;
   a converter configured to output a DC voltage from a commercial power supply; and
   a detection terminal connected to a ground of the commercial power supply via a pull-down resistor, and
the communication device comprises:
   a second transceiver configured to communicate with the first transceiver;
   a transformer supplied with an output of the converter;
   an electric double-layer capacitor charged with an output voltage of the transformer;
   a voltage converter configured to convert the output voltage of the transformer and to supply the voltage to the second transceiver;
   first and second photo-couplers supplied with the output of the converter; and
   a capacitor connected to a primary side of the second photo-coupler through a resistor, wherein
the second transceiver comprises first and second terminals supplied with outputs of the first and second photo-couplers, and a third terminal supplied with a charging voltage of the electric double-layer capacitor, and
occurrence of a power failure or detachment of the electronic device from the power supply device is detected in response to a combination of states of the first, second and third terminals.

14. The electronic device of claim 13, wherein
the second transceiver is configured to start determination of occurrence of power failure in response to variation in level of the first terminal and to start determining whether the detachment is executed or not in response to variation in level of the second terminal.

15. The electronic device of claim 14, wherein
when the second transceiver detects a state in which the level of the first terminal is a first level at a first number of times, the second transceiver is configured to detect the occurrence of power failure or the detachment.

16. The electronic device of claim 13, wherein
the second transceiver is configured to start determining whether power is recovered from the power failure in response to variation in level of the first terminal or power-on reset or not, or determining whether reattachment is executed or not.

17. The electronic device of claim 16, wherein
the second transceiver is configured to detect a state in which the power is recovered from the power failure when the second transceiver detects a state in which the level of the first terminal and a level of the third terminal are first levels at a first number of times, and
the second transceiver is configured to detect the reattachment when the second transceiver detects a state in which the level of the first terminal, a level of the second terminal and a level of the third terminal are second levels at a second number of times.

18. The electronic device of claim 13, wherein
the power supply device is a power meter, and the second transceiver is a communication unit which is configured to conduct communication with the power meter, the other meter or a network, to transmit a power failure detection result or a detachment detection result to the network and to transmit received meter reading data to the network.

* * * * *